United States Patent [19]
Komenaka

[11] Patent Number: 5,914,524
[45] Date of Patent: *Jun. 22, 1999

[54] SEMICONDUCTOR DEVICE

[75] Inventor: Kazuichi Komenaka, Yokohama, Japan

[73] Assignee: Kabushiki Kaisha Toshiba, Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/440,389

[22] Filed: May 12, 1995

[30] Foreign Application Priority Data

May 15, 1994 [JP] Japan .................................. 6-124450

[51] Int. Cl.⁶ ........................... H01L 23/62; H01L 27/112
[52] U.S. Cl. ........................ 257/529; 257/209; 257/665; 365/225.7
[58] Field of Search .................................. 257/209, 529, 257/665, 50, 530; 365/225.7

[56] References Cited

U.S. PATENT DOCUMENTS

| | | | |
|---|---|---|---|
| 4,984,054 | 1/1991 | Yamada et al. | 257/529 |
| 5,321,300 | 6/1994 | Usuda et al. | 257/529 |
| 5,383,156 | 1/1995 | Komatsu | 365/225.7 |
| 5,420,455 | 5/1995 | Gilmour et al. | 257/529 |
| 5,465,004 | 11/1995 | Lim et al. | 257/529 |
| 5,469,388 | 11/1995 | Park | 365/225.7 |
| 5,608,257 | 3/1997 | Lee et al. | 257/209 |
| 5,760,674 | 6/1998 | Gilmour et al. | 257/529 |

FOREIGN PATENT DOCUMENTS

| | | | |
|---|---|---|---|
| 60-180140 | 9/1985 | Japan . | |
| 6-252268 | 9/1994 | Japan | 257/665 |

*Primary Examiner*—David B. Hardy
*Attorney, Agent, or Firm*—Finnegan, Henderson, Farabow, Garrett & Dunner, L.L.P.

[57] ABSTRACT

A semiconductor device has a semiconductor substrate on which are formed semiconductor devices. A wiring is provided to make electrical connection between the devices. First fuse elements are formed on the substrate and connected to the wiring. A second fuse element is also formed on the same plane as the first fuse elements on the substrate and provided in proximity to a portion of each first fuse element to be blown. Both the first and second fuse elements may be formed by a composite layer of titanium nitride film and a titanium film formed over the titanium nitride film, and a tungsten or aluminium film formed over the composite layer. The first and second fuse elements may have the same width. The first fuse elements may be linearly arranged and two of the first fuse elements adjacent to each other may share the second fuse element, or a flow catchment, provided in proximity to both fuse elements.

28 Claims, 12 Drawing Sheets

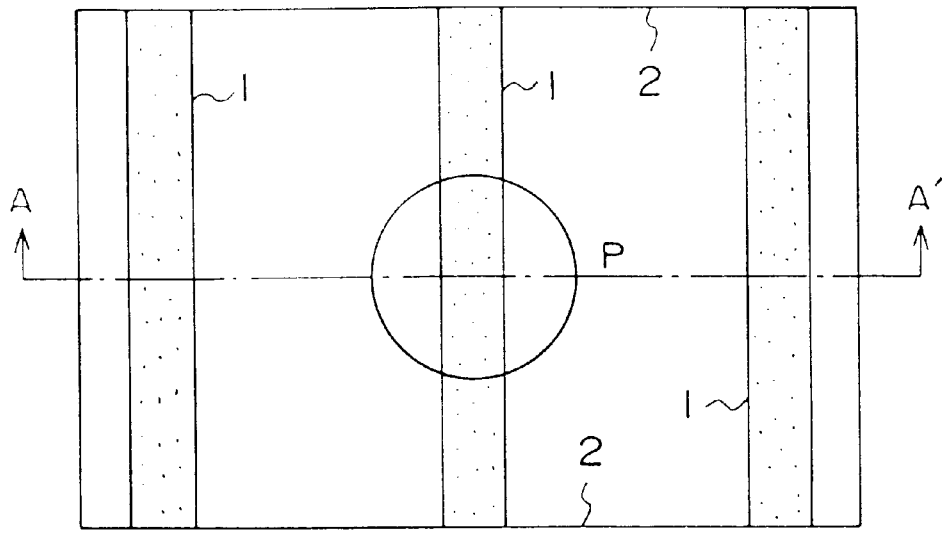
FIG. IA PRIOR ART
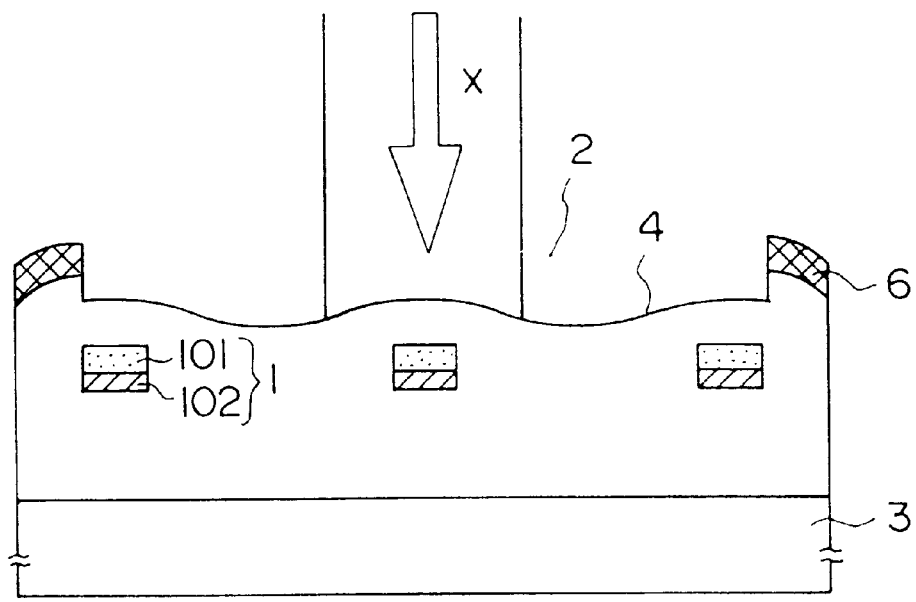
FIG. IB PRIOR ART

SEMICONDUCTOR DEVICE

BACKGROUND OF THE INVENTION

The present invention relates to a fuse element structure made of conductive metal and used in a semiconductor device.

With semiconductor elements integrated onto a semiconductor substrate (chip) in semiconductor devices becoming small, so that a huge number of such elements are included on a single semiconductor chip, the defect density has also increased, and low yield is a problem at the device development or initial mass production stage. To solve this problem, redundancy circuit techniques have been proposed and have come into practical use. A redundancy circuit that repairs defects that occur in the processes of manufacturing memory elements in particular will now be described. When a defect exists in a row, a column, or a cell that is part of an arrangement of memory cells, it is possible, by making available a number of spare rows or columns, to select one or more spare rows or spare columns when an address signal is input that corresponds to the defective part, thereby achieving operation as a normal device, even though the device has a defect. By incorporating this kind of redundancy circuitry, although the surface area of the chip increases, the yield is improved. In implementing this kind of redundancy circuit, it is important to select a means of what can be called programming, which assigns spare parts to addresses corresponding to defect locations which occur in a random manner from chip to chip. While a variety of such means exists, the most commonly used is that of laser-fusible elements, because of the small increase in chip surface area and process margin that is offered by this method. Fuse elements are often used in such applications in semiconductor devices.

While semiconductor devices having fuse elements according to the prior art are often made of polycrystalline silicon, because with polycrystalline silicon the contact resistance at a contact portion with the polycrystalline silicon substrate is high, recent years have seen an increase in the use of aluminum (Al) and tungsten (W), which are metals having low resistance. The shape is often a single bar or a shape having the part that is to be opened, or blown. The generally used means for blowing the fuses is the application of a laser beam.

In a semiconductor device having fuse elements according to the prior art, problems have arisen with the change of fuse element material from polysilicon to conductive metals such as Al, W, TiN/Ti/W (three layer structure of titanium nitride, titanium and tungsten) films. This problem is particularly prominent with a multilayer structure using TiN/Ti/W films.

FIGS. 1A and 1B will now be used to describe the fuse element part of a semiconductor device in the prior art. FIG. 1A is a top view of the fuse element part of a row fuse selector which is connected to a spare row decoder of a semiconductor memory such as a DRAM (Dynamic Random Access Memory), while FIG. 1B is a cross-sectional view of the part indicated by the line 1B—1B in FIG. 1A. In FIGS. 1A and 1B, three fuse elements 1 are shown, both ends of each fuse element being connected to semiconductor devices which form a desired circuit. Note, however, that such devices are hidden by an insulating film 4 and a passivation film 6, and so are not shown in FIG. 1A of the drawing. What is shown is only a hole (a fuse window 2) which is formed in part of the insulating film 4 and the passivation film 6. The shape of the fuse element, as shown in FIG. 1A, is that of a single bar, this being the generally used shape. Referring to the cross-sectional view presented in FIG. 1B, the fuse elements 1 are disposed over a semiconductor substrate 3 via the insulating film 4 of $SiO_2$, and over which element is also formed $SiO_2$ or the like as the insulating film 4.

Each fuse element 1 is made from a TiN/Ti/W film, this being a TiN/Ti (two layer structure of TiN and Ti) film 102, on top of which is formed a tungsten (W) film 101.

To blow this fuse element, a laser beam is generally used, laser beam being aimed at the area P surrounded by the circle in FIG. 1A in the direction of the arrow X as shown in FIG. 1B to blow the fuse element.

The condition of a fuse element of the prior art after it is blown by the above-noted method will now be explained with reference to FIGS. 2A to 2D and 3.

These figures show in cross section the area corresponding to the area P as shown in FIG. 1A. First, FIG. 2A is a cross-sectional view of the initial condition, with FIG. 2B showing in cross section the condition when the laser beam first strikes. Immediately after the laser beam strikes in the direction of the arrow X, the $SiO_2$ insulating film 4 and the tungsten film 101 are destroyed and blown away. However, because the TiN/Ti film 102 is at the bottom surface, it remains, and is melted by the energy of the laser beam. In addition, the energy of the laser beam causes the melted TiN/Ti film 102 to begin to move in the direction of the arrows Z shown in FIG. 2C, so that it moves from the bottom surface of a groove 200 to accumulate at the corners of the bottom surface. Then, as this movement to the side surfaces proceeds, the TiN/Ti film 102 remains from the corners of the bottom of the groove 200 extending to the side surfaces, as shown in FIG. 2D. As shown in FIG. 3, a top view corresponding to FIG. 2D, the fuse element is not completely blown. Hence this is the problem existing in the prior art.

SUMMARY OF THE INVENTION

In view of the above-noted problem existing in the prior art, the present invention has as an object the provision of a semiconductor device in which a residual fuse element film is prevented from remaining on the fuse itself, so that the fuse element is blown both in terms of appearance and electrically.

To achieve the above-noted object, the present invention provides a semiconductor device having a semiconductor substrate on which are formed a plurality of semiconductor devices and a wiring which is formed on the semiconductor substrate and makes electrical connection between the semiconductor devices. At least a first fuse element is formed on the semiconductor substrate and connected to the wiring; and at least a second fuse element is formed on the same plane as the first fuse element on the semiconductor substrate and provided in proximity to at least one side of a portion of the first fuse element to be opened.

The present invention further provides a semiconductor device having a semiconductor substrate on which are formed a plurality of semiconductor devices and a wiring which is formed on the semiconductor substrate and makes electrical connection between the semiconductor elements. At least a first fuse element is formed on the semiconductor substrate and connected to the wiring, the first fuse element having a portion to be opened whose width is narrower than other portion of the first fuse element not to be opened; and second fuse elements are formed on the same plane as the first fuse element on the semiconductor substrate, provided in proximity to both sides of the portion of the first fuse element to be opened and made of the same material as that of the first fuse element.

The present invention further provides a semiconductor device having a semiconductor substrate on which are formed a plurality of semiconductor devices and a wiring which is formed on the semiconductor substrate and makes electrical connection between the semiconductor elements. A plurality of fuse elements are formed on the semiconductor substrate and connected to the wiring; and an insulating film is formed on the semiconductor substrate and covers at least the fuse elements. A portion of the insulating film located in proximity to at least one side of a portion of each fuse element to be opened is lower than the surface of each fuse element on the semiconductor substrate, and the fuse elements are aligned on the semiconductor substrate and two of the fuse elements adjacent to each other share proximity to the portion of the insulating film.

The present invention further provides a semiconductor memory including at least a first and a second selector each having a series circuit of a first fuse element and a first transistor of a first conductive type, a source of the first transistor being connected to the fuse element, a drain of the first transistor having applied a reference potential. An inverter has an input side connected to the fuse element at a side thereof not connected to the source of the first transistor. A second transistor of a second conductive type has a drain connected to the inverter at the input side thereof and a source to which is applied a power potential. At least a first and a second decoder are both connected to the inverter at an output side thereof; and a spare decoder is connected to the inverter at the output side thereof. In operation, by fusing either fuse element of the first and second selectors, either of the first and second decoders is electrically replaced with the spare decoder. The semiconductor memory further includes means for ensuring that the irradiated fuse element is blown, so that the circuit therethrough is disconnected.

The present invention further provides a random access memory having at least one memory section provided on a semiconductor substrate and at least one decoder section having at least one decoder and spare decoder, the decoder section being provided in an area surrounding the memory section and being electrically connected to the memory section. A first fuse element is provided adjacent to the decoder section and electrically connected to the decoder and spare decoder, so that by blowing the fuse element, the decoder is electrically replaced with the spare decoder. There is further provided to at least one side of a portion of the fuse element to be opened, means for ensuring the opening of that portion of the fuse element.

BRIEF DESCRIPTION OF THE DRAWINGS

FIGS. 1A and 1B are respectively a top view and a cross-sectional view of a fuse element;

DESCRIPTION OF THE PREFERRED EMBODIMENTS

Preferred embodiments of the present invention will be presented below, with reference made to the accompanying drawings.

First, the first embodiment of the present invention will be described, with reference being made to FIGS. 4 to 9B. This description will be presented with reference to a semiconductor memory having a repairable manufacturing-process-introduced defect. In the case in which a defect exists in a row, a column, or a memory cell of an arrangement of memory cells, there is made available a number of spare rows or columns, of which one or more spare rows or spare columns can be selected when an address signal is input that corresponds to the defective part, thereby achieving operation as a normal device, even though the device has a defect.

Figure 2A:
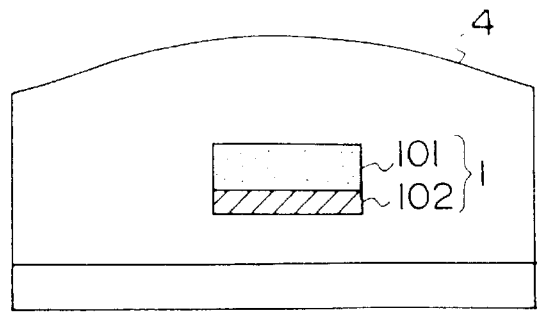
FIGS. 2A to 2D are cross-sectional views which show a laser beam blowing a prior art fuse element.
Figure 2B:
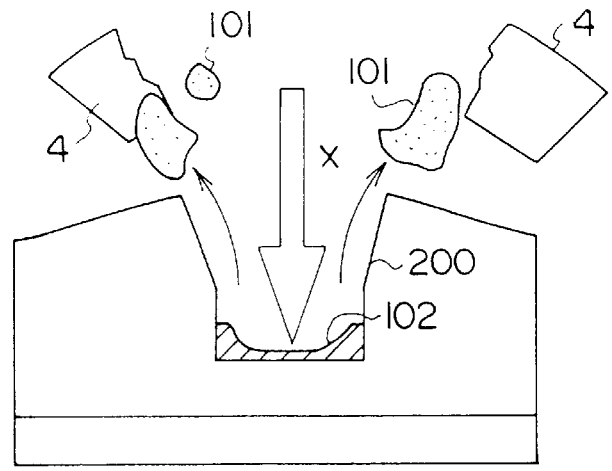
Figure 2C:
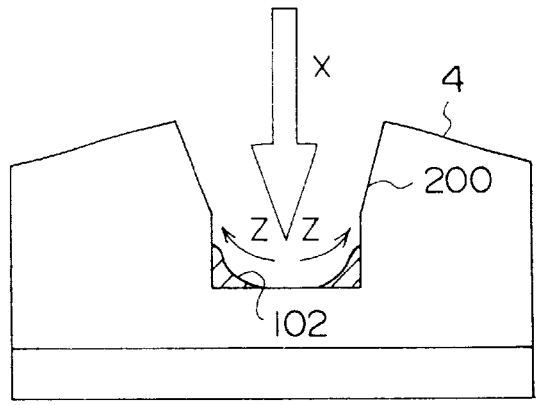
Figure 2D:
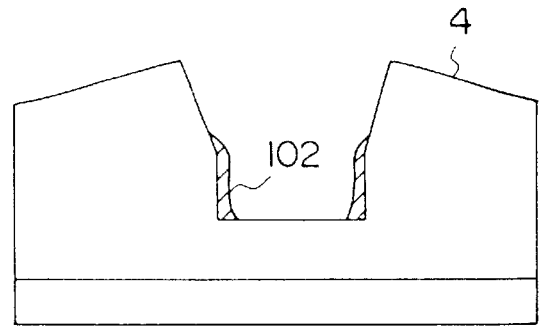
Figure 3:
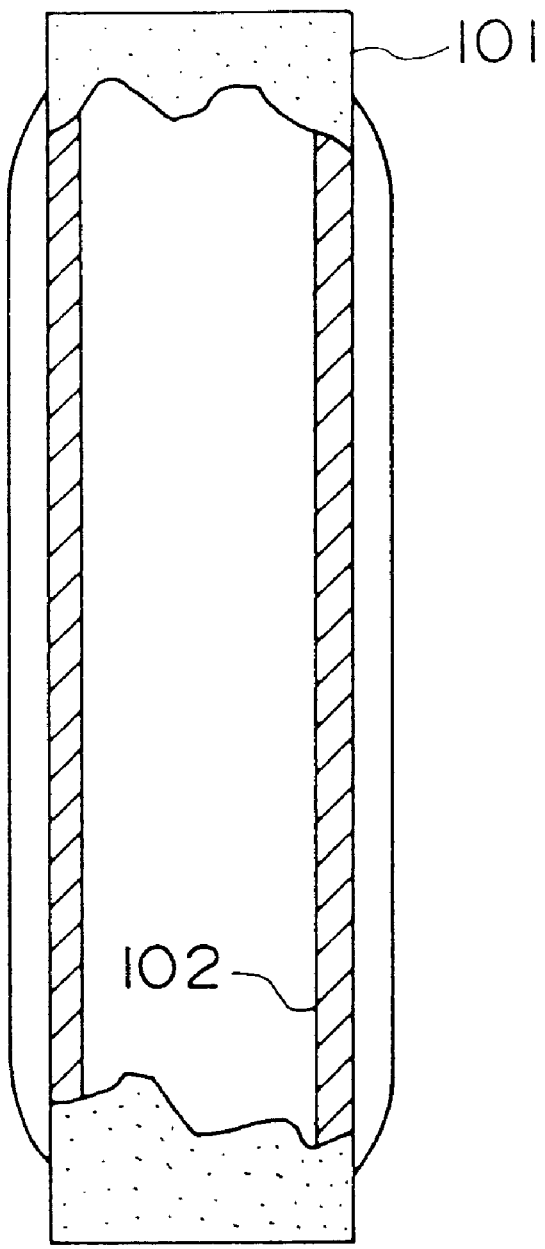
FIG. 3 is a top view corresponding to FIG. 2D.
Figure 4:
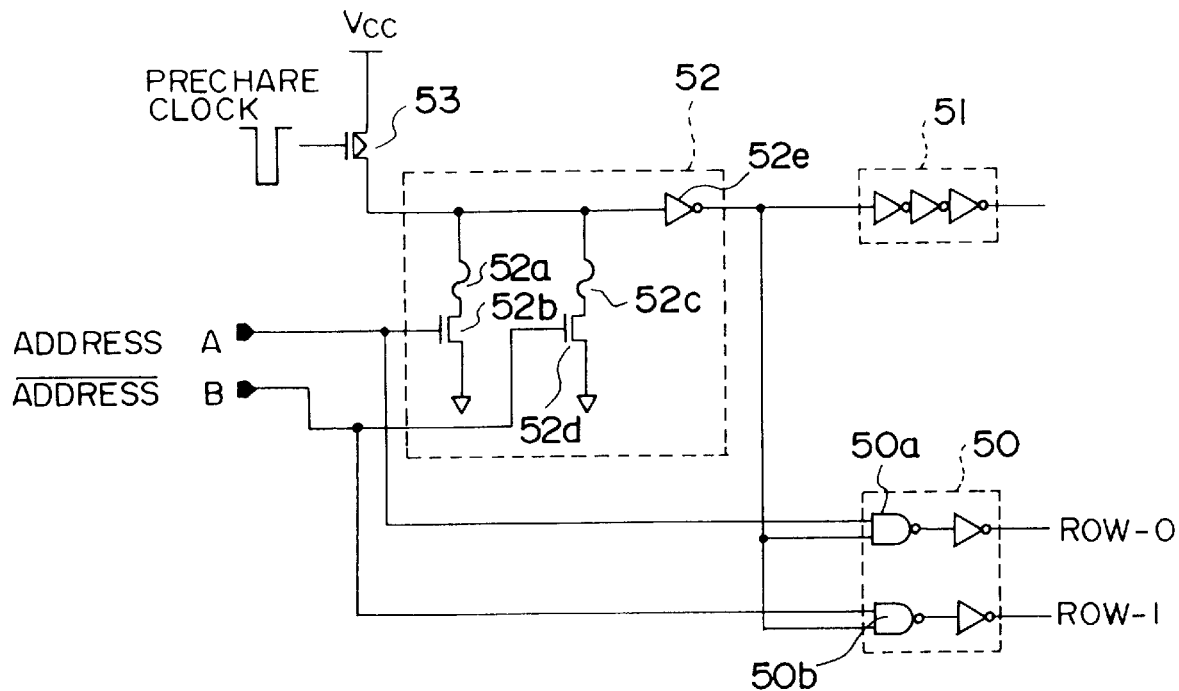
FIG. 4 is a drawing which illustrates a row fuse selector in a DRAM to which the fuse element of the first embodiment of the present invention is applied.

FIG. 4 shows an example of the use of a fuse element in a row fuse selector which is connected to a spare row decoder of a semiconductor memory such as a DRAM. This semiconductor memory has a means which can be considered to be a type of programming, which assigns addresses corresponding to defect locations, which occur randomly from chip to chip, to spare parts. This means is often used with laser blowing of fuse elements, which offers a small increase in chip surface area and a process margin. Fuse elements in a semiconductor device are often used in such semiconductor devices. A spare row decoder is added to a group of row decoders, and a row fuse selector is inserted in-between the address input and the spare row decoder, so that an appropriate fuse element which is connected at that point can be blown, with the spare row decoder replacing the defective row decoder of the above-noted group of row decoders. A spare decoder which uses a fuse element can also be applied to a column decoder.

The circuit shown in FIG. 4 will be described. In the figure, a row decoder section 50 has decoders corresponding to a plurality of rows. Shown are only two decoders corresponding to rows 0 and 1. A spare row decoder 51 is connected to each input of NAND circuits 50a and 50b of the decoders corresponding to rows 0 and 1, respectively. Further, connected to these decoders is a row fuse selector 52 which has a plurality of series circuits of a fuse element and a FET (Field Effect Transistor) and also has an inverter 52e. Shown are only two series circuits corresponding to the rows 0 and 1. Fuse elements 52a and 52c are connected to the input of the inverter 52e. Further, the fuse elements 52a and 52c are connected to the sources of N channel FETs 52b and 52d the drains of which are grounded.

Further, connected to the input of the inverter 52e is the drain of P channel FET 53, to the source of which is applied a power potential Vcc. The inverter 52e is connected at its output to the inputs of the NAND circuits 50a and 50b and the spare low decoder 51. The NAND circuits 50a and 50b are connected at their other inputs to the gates of the FETs 52b and 52d.

How the circuits of FIG. 4 functions will be described. In a normal operation, the FET 52b turns on when an address signal of H (high) level is applied via an address terminal A. This causes the input of the inverter 52e to be grounded via the fuse element 52a and the FET 52b. Since the output of the inverter rises to H level, the decoder corresponding to the row 0 is assigned. Likewise, the decoder corresponding to the row 1 is assigned when an address signal of H level is applied to an address terminal B.

It is assumed that the decoder corresponding to the row 0 becomes defective and hence the use of the spare row decoder 51 is required instead of the defective decoder. In this case, the fuse elements 52a is blown and a precharge clock of L (low) level and an address signal of L level are applied to the gate of the FET 53 and the address terminal B, respectively. This causes the FET 52d to turn off and hence the power potential Vcc is applied to the inverter 52e via the FET 53 which has turned on. Since the output of the inverter 52e drops to L level, the spare decoder 51 is assigned. The fuse element 52c is blown if the decoder corresponding to the row 1 becomes defective.

Figure 5:
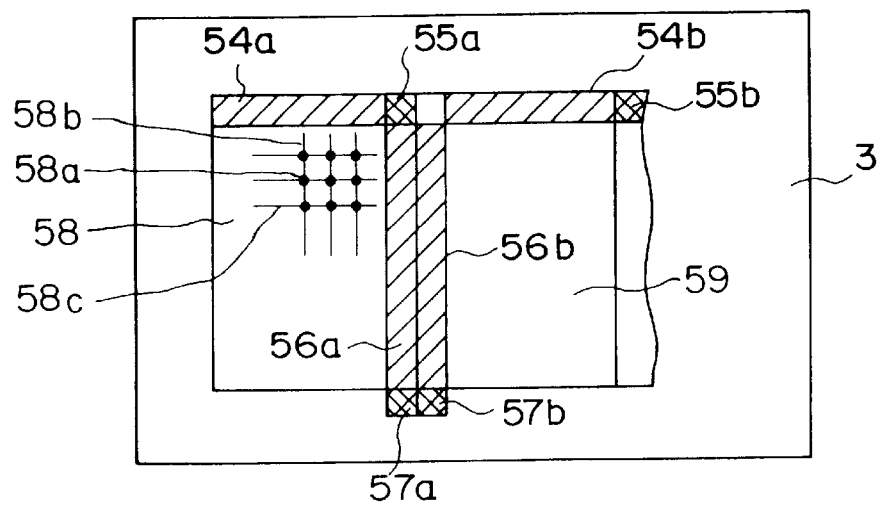
FIG. 5 is a top view of a semiconductor memory on a semiconductor substrate according to the present invention.

FIG. 5 is a top view which shows the position of row fuse elements of a memory section formed on a semiconductor substrate 3. In the figure, a first and a second memory section 58 and 59 are provided adjacent to each other on the semiconductor substrate 3. Provided in the area "surrounding" the memory section 58 are a row decoder section 54a with row decoders and a spare row decoder and a column decoder section 56a with column decoders and a spare column decoder connected to the memory sections 58. Adjacent to the decoder sections, there are provided row fuse section 55a and column fuse section 57a having a plurality of row and column fuse elements and electrically connected to the row and column decoder sections, respectively. If one of the decoders of the row decoder section 54a becomes defective, one of the fuses of the row fuse section 55a is blown to electrically replace the defective decoder with the spare decoder. Likewise, provided in the area surrounding the memory section 59 are a row decoder section 54b with row decoders and a spare row decoder and a column decoder section 56b with column decoders and a spare column decoder. Further, a row fuse section 55b and a column fuse section 57b are provided adjacent to the decoders 54b and 56b, respectively.

Each memory section is provided with a plurality of memory cells, word lines and bit lines. Shown in FIG. 5 are memory cells 58a, word lines 58b and bit lines 58c. A row decoder of the row decoder section 54a selects one from the word lines 58b in response to an externally supplied row address signal. And a column decoder of the column decoder section 56a selects one from the bit lines 58c in response to an externally supplied bit address signal. One of the memory cells 58a is then selected.

Figure 6:
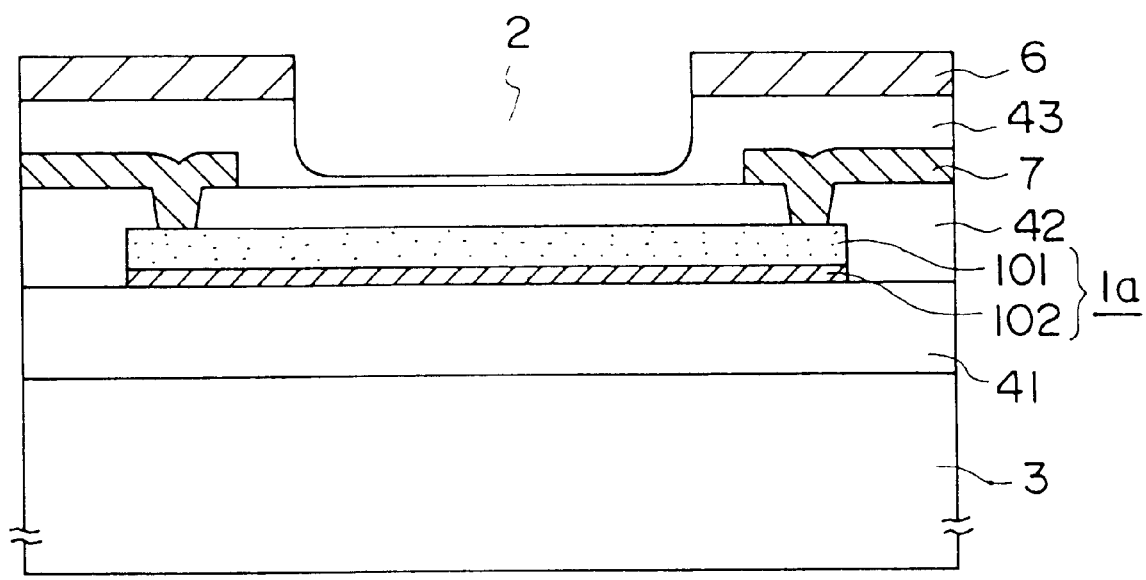
FIG. 6 is a cross-sectional view of a semiconductor substrate which shows the fuse element part of the first embodiment of the present invention.

FIG. 6 is a cross-sectional view of the fuse elements part of the semiconductor memory, in which the semiconductor devices formed on the semiconductor substrate 3 are not shown. A fuse element 1a is formed on an insulating film 41, made of $SiO_2$ or the like, which covers the surface of the silicon semiconductor substrate 3. Inside the insulating film 41 is formed and located a gate electrode (not shown in the drawing) which is formed from the first wiring layer in the manufacturing process. The fuse element 1a is a bar of the prescribed length, and is formed from the TiN/Ti film 102 which is formed from the second wiring layer in manufacturing process, and from a tungsten film 101 which is formed on top of that film. On top of the insulating film 41 is formed an insulating film 42, which covers the fuse element 1a and which is made, for example, of an insulating film of $SiO_2$ made by CVD (Chemical Vapor Deposition). On top of this insulating film 42 is the third wiring layer in the manufacturing process, which is aluminum wiring 7. This aluminum wiring 7 makes electrical connections between MOS transistors or the like which make up the integrated circuit of the semiconductor device, and the fuse element is inserted between portions of this wiring. The fuse element 1a is, at its both ends, electrically connected to the aluminum wiring 7 via contact holes.

On top of the insulating film 42 is formed an insulating film 43, which is made, for example, of $SiO_2$ by CVD. And on top of this insulating film 43 is formed a passivation film 6, made of $Si3N_4$ or the like. The insulating films 41, 42, and 43 make up the insulating film 4. The passivation layer 6, above the fuse element 1a, and part of the insulating film 43 which is contiguous with it have formed in them, by etching, a fuse window 2, enabling a view of the central part of the fuse element from the window 2 through part of the insulating film 43. A laser beam is aimed through this window at the part of the fuse element that is visible through the window 2, thereby cutting the approximately center part (blown part) of the visible section of the fuse element.

Figure 7A:
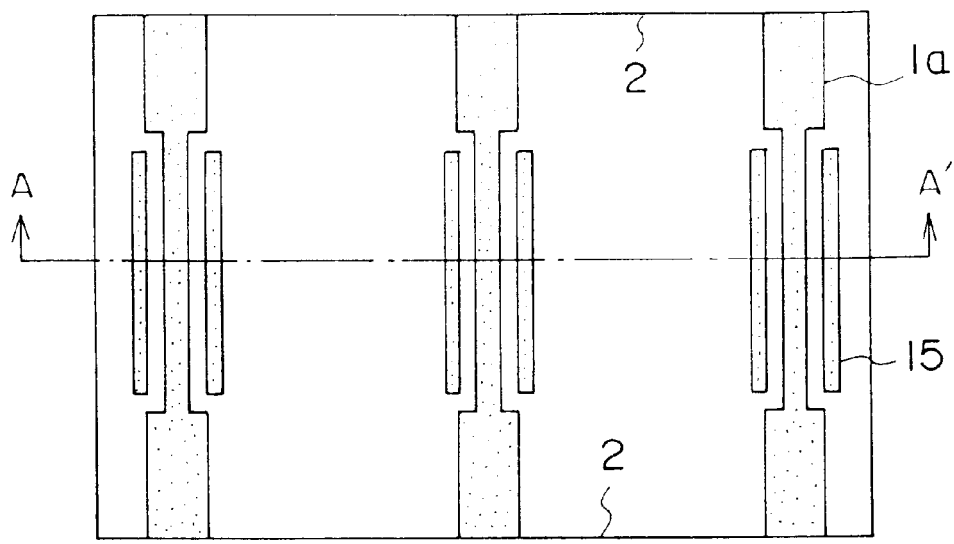
FIG. 7A and 7B are top view and a cross-sectional view of the fuse element on a semiconductor substrate of the first embodiment of the present invention.
Figure 7B:
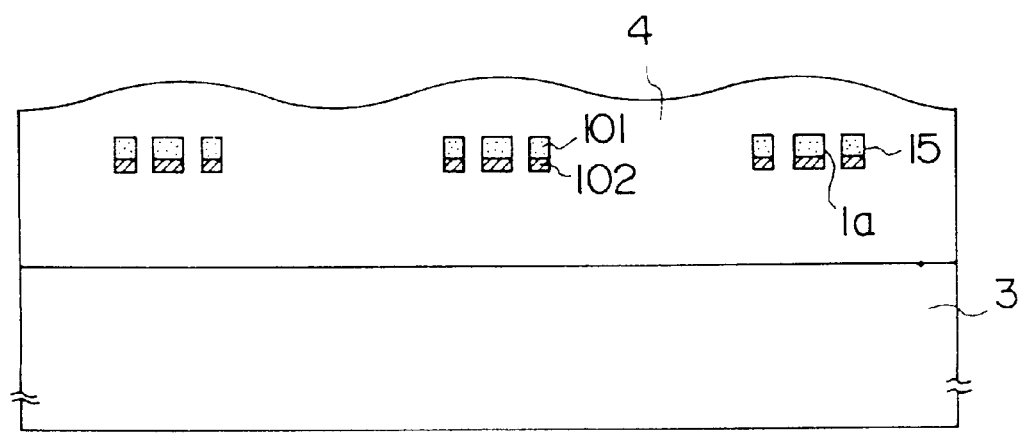

FIG. 7A shows a top view of the part of a semiconductor substrate in which is located the fuse element of the semiconductor device of the first embodiment of the present invention as used in FIGS. 4, 5 and 6. FIG. 7b is a cross-sectional view through the line 7B—7B for the first embodiment shown in FIG. 7A. Fuse elements which will be described later as the second to fourth embodiments are also applicable to the semiconductor devices shown in FIGS. 4 and 5. In this embodiment, as shown in FIG. 7A, the fuse elements 1a are so formed that the portion to be blown is narrower than other parts of the elements not to be blown and dummy fuse elements 15 are located on both sides of the fuse elements 1a at its narrow portion. These dummy fuse elements 15 are independent from the fuse elements 1a both in outer appearance and electrically, and are positioned so as to have no electrical effect on the semiconductor device itself. Viewed in cross-section, as shown in FIG. 7B, on top of the silicon semiconductor substrate 3, there exist the fuse elements 1a, with an insulating film 4 of, for example, $SiO_2$ between them and the silicon semiconductor substrate 3. At the same height at the above-noted fuse elements 1a, there are located dummy fuse elements 15, and on top of them is a covering passivation layer (not shown in the drawing). The fuse elements 1a and the dummy fuse elements 15 have same structure and are made of the same materials, this being a double-layer structure of a TiN layer and a Ti layer (TiN/Ti film 102) and on top of which is formed a film 101 of a refractory metal, such as tungsten (W).

Figure 8A:
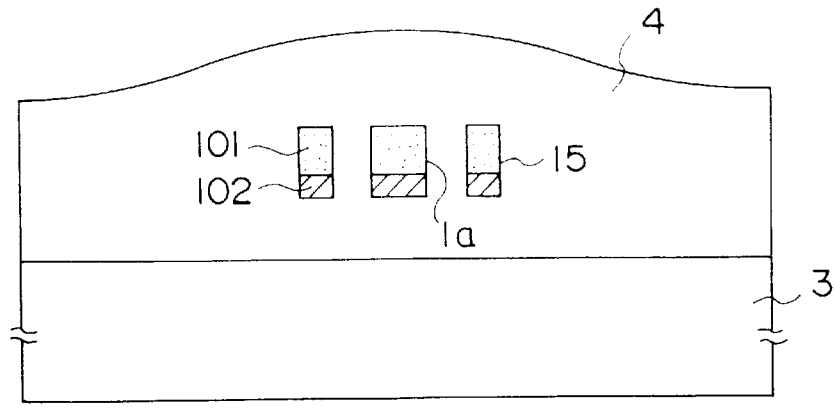
FIGS. 8A to 8C are cross-sectional views which show a laser beam blowing the fuse element of the first embodiment of the present invention.
Figure 8B:
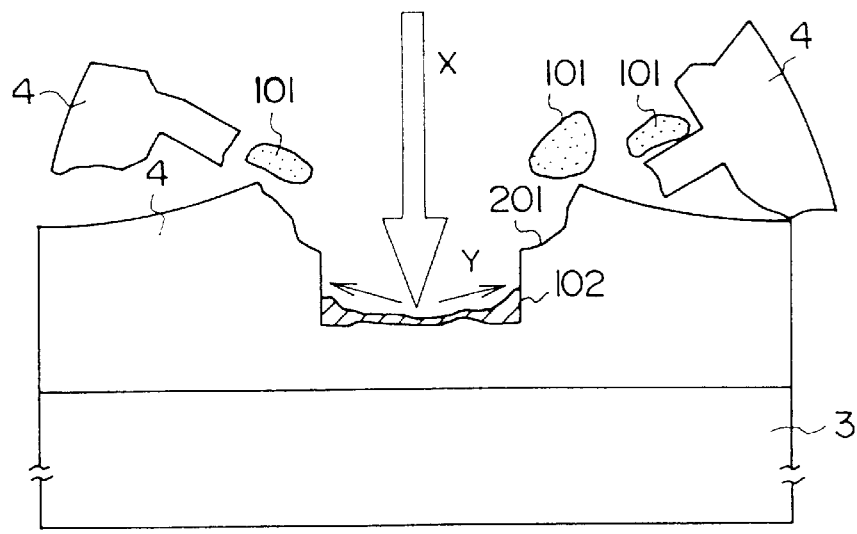

With reference to FIGS. 8A to 9B, the effect of the present invention will now be described. FIG. 8A shows the condition of one of the fuse elements 1a and the dummy fuse elements 15 before the laser beam strikes, while FIG. 8B shows the condition of these elements immediately after the laser beam strikes. As shown in the drawing, immediately after the laser beam strikes from the direction indicated buy the arrow X, the insulating film 4, made of SiO$_2$ or the like and the tungsten film 101 are destroyed and blown away. When this occurs, the insulating film 4 and tungsten film 101 on top of the fuse element 1a and the dummy fuse elements 15 are destroyed and blown away. In the prior art this would result in a groove having a width of only the fuse element, but in this embodiment a groove 201 has a width that is larger to the extent of the dummy fuse elements 15. Additionally, as in the prior art, because of the TiN/Ti film 102 on the bottom surface, it remains there and is melted by the energy of the laser beam. Further energy from the laser beam causes the melted TiN/Ti film 102 to begin to move in the direction of the arrows Y, so that is accumulates on corners of the bottom of the groove 201. The movement towards the sides of the groove 201 proceeds further; and, while some of material is splattered, the TiN/Ti film 102 remains on an area extending from the corners of the bottom to the two sides of the groove 201.

Figure 8C:
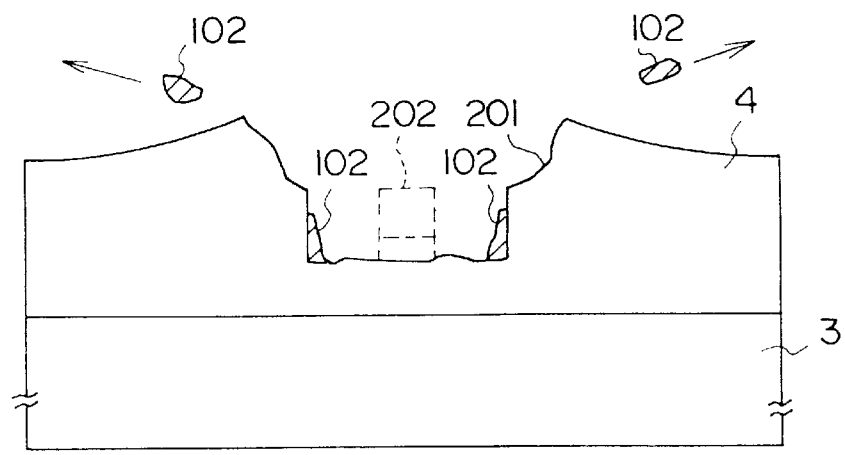
Figure 9A:
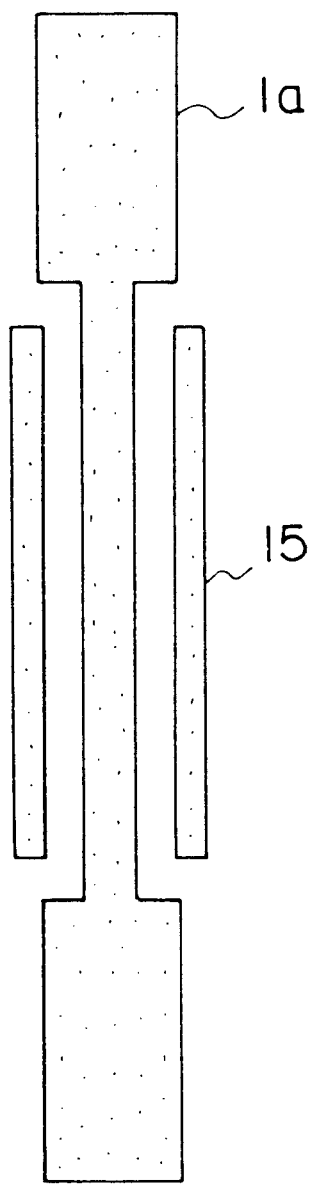
FIGS. 9A and 9B are top views of the fuse element of the first embodiment according to the present invention.
Figure 9B:
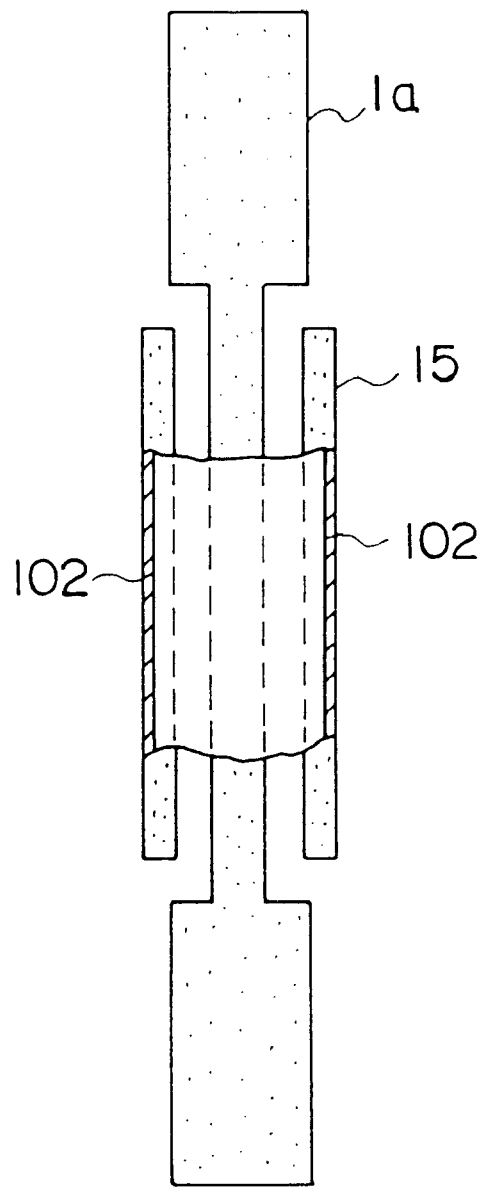

Since the fuse element 1a is located in the area indicated by the broken line 202 in FIG. 8C, even if the TiN/Ti films 102 of the dummy fuse elements 15 remain in the groove 201 in location of the dummy fuse elements 15, the fuse element 1 does not electrically conduct. This is easier to grasp from the top views of FIG. 9A and FIG. 9B. FIG. 9A shows an enlarged view of the fuse element of this embodiment before being blown by the laser beam. FIG. 9B shows an enlarged top view of the fuse element after being blown by the laser beam. In FIG. 9B, while the residual TiN/Ti films 102 remain in a way that the two ends of each of the dummy fuse elements 15 are joined, they do not exist in the region of the blown part of the fuse element 1a. This means that the blowing of the fuse element by the laser is complete, and fuse element 1a will not thereafter electrically conduct. This greatly reduces the failures in semiconductor devices which use conductive metal fuse elements.

Figure 10:
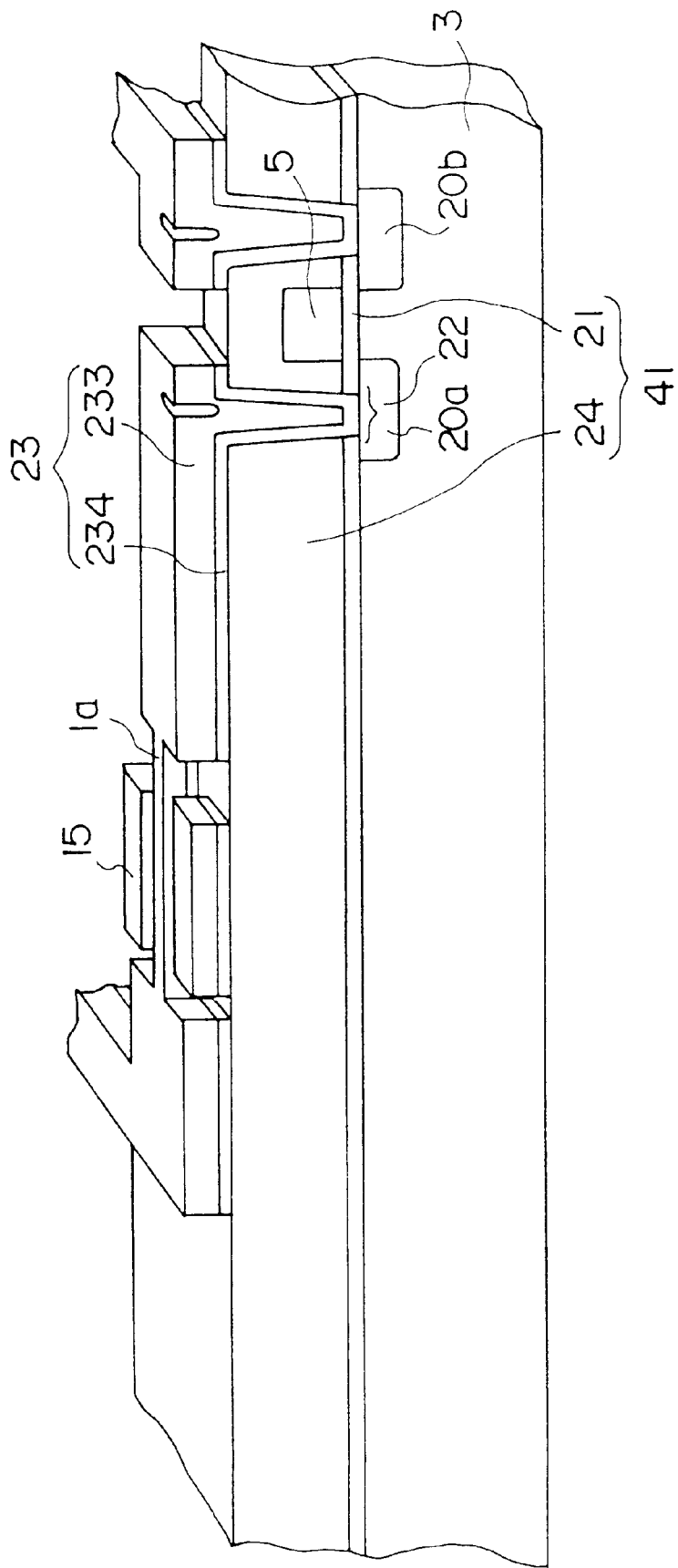
FIG. 10 is a vertical sectional perspective view of the semiconductor device of the first embodiment according to the present invention.

FIG. 10 is a cross-sectional view of the wiring part on the semiconductor substrate according to the first preferred embodiment. On the silicon semiconductor substrate 3 are formed on a drain region 20a and a source region 20b of a MOS transistor, and on the surface of this transistor is formed on a thermally grown oxide film 21 of SiO$_2$ or the like. Then, on top of that is formed, from polysilicon or the like, a gate electrode 5 of the MOS transistor which is formed from the first wiring layer. The thermally grown oxide layer 21 has formed on top of it an interlayer insulating film 24 of SiO$_2$ or the like by CVD, so as to cover the gate electrode 5.

The thermally grown insulating film 21 and interlayer insulating film 24 form an insulating film 41. A contact hole 22 is formed in the insulating film 41, and on top of the interlayer insulating film 24 is formed a wiring line 23 which has wiring such as a bit line formed from the second wiring layer and embedded in the contact hole 22. This wiring line 23 consists of a TiN/Ti film 234 and thereon a tungsten film 233 of low resistance. The TiN/Ti film 234 consists of a base layer which is a TiN layer over which a Ti layer is formed. This TiN/Ti film 234 is capable of maintaining a stable and lower contact resistance, without reacting with the drain region 20 of the semiconductor substrate 3. Therefore, compared to the prior art wiring line made of polysilicon/ silicide, this wiring line 23 has a smaller resistance at the ohmic contact juncture with the silicon substrate and offers good characteristics. This advantage becomes more prominent as the patterning becomes finer. The fuse element 1a is formed from the same wiring layer as the wiring line 23 and, further, the dummy fuse elements 15 are formed on both sides of the fuse element 1a.

Next, the second embodiment of the present invention will be described, with reference to FIG. 11.

Figure 11:
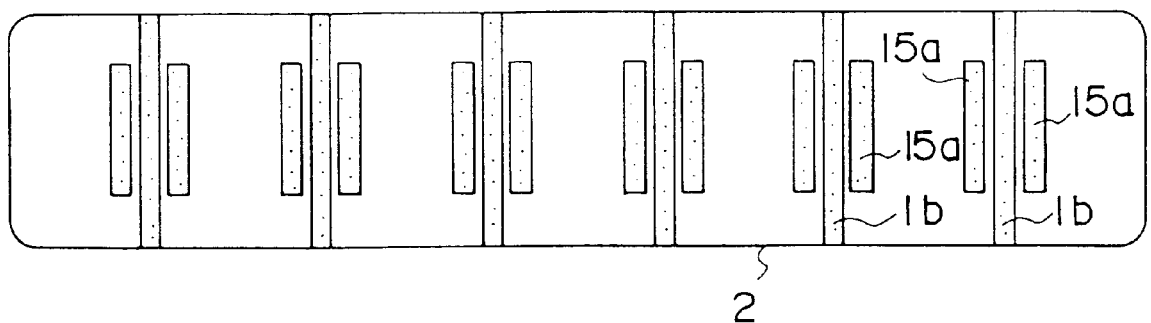
FIG. 11 is a top view of the fuse element of the second embodiment according to the present invention.

FIG. 11 shows a top view of fuse element parts that are located inside a fuse window 2, which is formed in a passivation film and insulating film (both not shown) of a semiconductor device. A plurality of fuse elements 1b are arranged in a fuse column on top of an insulating film which is formed on top of the semiconductor substrate. The dummy fuse elements 15a are formed so as to be arranged in proximity to each side of the fuse elements 1b. Inside the fuse window 2, an insulating film is formed so as to cover the fuse elements 1b and the dummy fuse elements 15a. A laser beam is aimed through this fuse window 2 at the desired fuse element 1b and dummy fuse elements 15a of the fuse column to blow elements 1b. In the first embodiment of the present invention, the part of the fuse element 1a that is to be blown is made narrower than the width of other part of the fuse element not to be blown, and dummy fuse elements 15 were provided at both sides of the narrowed part of the fuse element 1a. The dummy fuse elements 15 in that embodiment have a uniform width which is somewhat narrower than the part of the fuse element 1a to be blown. However, in the second embodiment of the present invention, there is a common width that is shared by both the fuse element 1b and the dummy fuse elements 15a, so that when fuse element 1b and dummy fuse elements 15a are blown, the groove or depression that forms after the dummy fuse elements 15a evaporate is larger, so that the electrical break in the fuse element is reliably made.

Next, the third embodiment of the present invention will be described, with reference made to FIG. 12.

Figure 12:
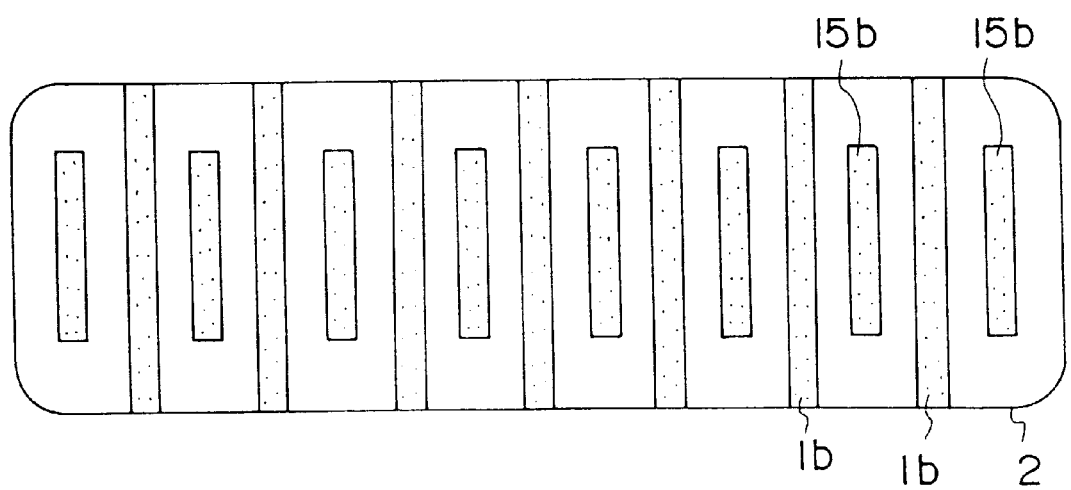
FIG. 12 is a top view of the fuse element of the third embodiment according to the present invention.

FIG. 12 is a top view which shows a fuse element part located within a fuse window 2 formed in a passivation film and an insulating film (both not shown) of a semiconductor device. A plurality of fuse elements 1b are arranged in a fuse column on top of an insulating film which is formed on a semiconductor substrate. Dummy fuse elements 15b are arranged one each between each pair of adjacent fuse elements 1b and in proximity to these fuse elements in the fuse column. That is, because each fuse element 1b forms a part of an element which is blown together with the dummy fuse elements 15b disposed on both sides of the fuse element, each fuse element 1b shares a dummy fuse element 15b with neighboring fuse element 1b. Inside the fuse window 2 is formed an insulating film so as to cover the fuse elements 1b and the dummy fuse elements 15b. A laser beam is aimed through this fuse window 2 at a desired fuse element 1b and dummy fuse elements 15b of the fuse column to blow these elements. In this embodiment, because the widths of the fuse elements 1b and the dummy fuse element 15b are the same, when a fuse element 1b and dummy fuse elements 15b are blown, the depression or groove that is formed after the dummy fuse elements 15b evaporate is larger, and there is reliable electrical breakage of the fuse element. Furthermore, because one dummy fuse element 15b is shared between neighboring fuse elements 1b, the shrinking of the size of elements and the increase in the level of integration are facilitated.

Next, the fourth embodiment of the present invention will be described, with reference being made to FIGS. 13A and 13B.

Figure 13A:
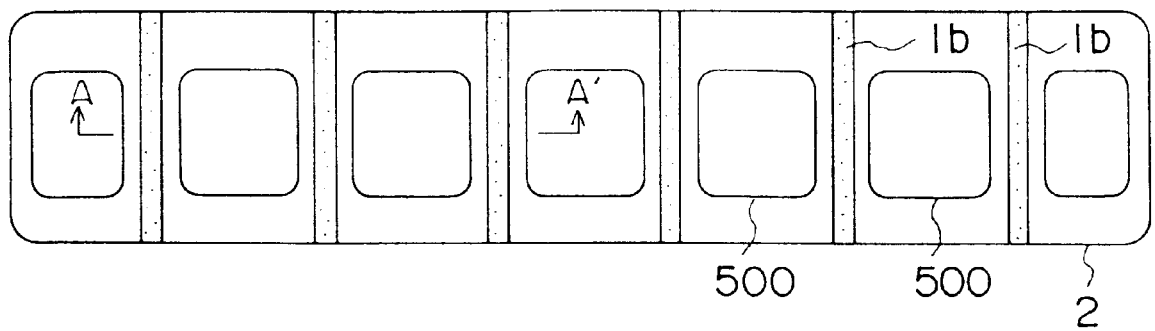
FIGS. 13A and 13B are a top view and a cross-sectional view of the fuse element on a semiconductor substrate according to the present invention.
Figure 13B:
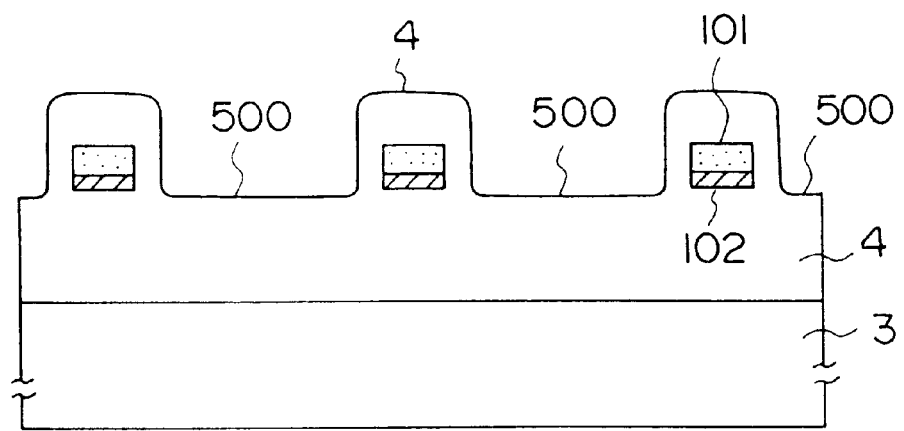

FIG. 13A is a top view which shows fuse element parts located inside a fuse window 2 that is formed in a passivation film (not shown) and in an insulating film formed on a semiconductor substrate, while FIG. 13B presents a cross-sectional view along the line A—A' shown in FIG. 13A. A plurality of fuse elements 1b are arranged in a fuse column on top of an insulating film (not shown in FIG. 13A) which is formed on a semiconductor substrate. In this embodiment, dummy fuses are not used. Instead, a depression or groove 500 is formed so as to be disposed between fuse elements 1b and in proximity to the fuse elements 1b in the fuse column. That is, the depression 500 is provided on both sides of the part of each fuse element 1b that is to be blown. In this case, while the typical depression 500 is provided between two fuse elements, in the case if there is no neighboring fuse element 1b, a depression 500 is added on the side of the fuse element 1b which does not have a neighboring fuse element 1b. Looking at the cross-section of the fuse element 1b, as shown in FIG. 13B, in the same manner as in the second embodiment of the present invention, an insulating film 4 is formed on the semiconductor substrate, with a fuse element 1b formed over it, and with an insulating film 4 of $SiO_2$ or the like covering both of these. In addition, over this a passivation film (not shown in the drawing) is formed. The above-noted depressions 500 are provided on both sides of the fuse elements 1b, and the bottom surface of these depressions are disposed so as to be below the bottom surfaces of the fuse elements 1b.

As described above, the feature of this embodiment of the present invention is that it does not use the dummy fuse elements which are used in the other embodiments, instead having depressions in the locations in which dummy fuse elements were provided in the other embodiments. Another feature of this embodiment is that a plurality of fuse elements are arranged in line, with the grooves or depressions which are formed between each pair of fuse elements being shared between two neighboring fuse elements. Because one depression or groove is shared by neighboring fuse elements, and thus is available to catch fluid flow from either or both, the shrinking of the size of elements and the increase in the level of integration are facilitated.

Of the features of this embodiment of the present invention, although the forming of depressions or grooves on both sides of the fuse elements is prior art (refer to the disclosure in the Japanese Laid-Open Patent Application Publication Sho 60-180140), this was the case of a depression or groove being formed at a single fuse element, there being no language or teaching of either the formation of depressions or grooves at each of a plurality of fuse elements or the sharing of grooves or depressions by neighboring fuse elements.

Next, the operation of this embodiment will be described. A laser beam is aimed at the part of a fuse element 1b shown in the arrangement of FIG. 13A and FIG. 13B to be blown. Immediately after the laser beam is aimed at a fuse element 1b from above the fuse window 2, the insulating film 4 and the tungsten film 101 of the fuse element 1b are destroyed and blown away. Whereas in the prior art a groove only as wide as the fuse element 1 was formed, in this embodiment, because of the existence of the depression 500, the thin walls of the insulation film on the sides of the fuse element 1b are also destroyed, so that a groove as wide as the depression 500 is formed. In the same manner as the prior art, because of the TiN/Ti film 102 on the bottom surface, it remains and is melted by the energy of the laser beam. In addition, the further energy of the laser beam causes the melted TiN/Ti film 102 to start moving upward to the fuse window 2, so that it attempts to exit the bottom surface where the fuse element 1b was in the direction of the depression 500. The Tin/Ti film 102 from the bottom surface where the fuse element was is splattered, so that the TiN/Ti film 102 does not remain on both sides walls of the groove as was the case with the prior art, resulting in absolutely no electrical conduction. Because the insulating film 4 between the fuse element 1b and the depression 500 is completely destroyed and removed, there are no inner side walls on which the TiN/Ti film 102 can be melted and remain, which was a problem with the prior art, and the fuse element 1b is blown both in terms of appearance and electrically. This greatly reduces the failures in semiconductor devices which use conductive metal fuse elements.

Next, the manufacturing process to form the groove or depression on both sides of the fuse element part that is to be blown in this embodiment will be described. Generally, after an aluminum wiring process completed, a passivation film is formed, after which the processes which form electrode pads and the fuse window opening are performed. The depression 500 of this embodiment is formed after forming the electrode pads and fuse element window, by applying photoresist on the areas other than the area of the depression, and using anisotropic etching such as RIE (reactive ion etching) from above. By doing this, the depression 500 as shown in FIG. 13A and FIG. 13B is formed.

Figure 14:
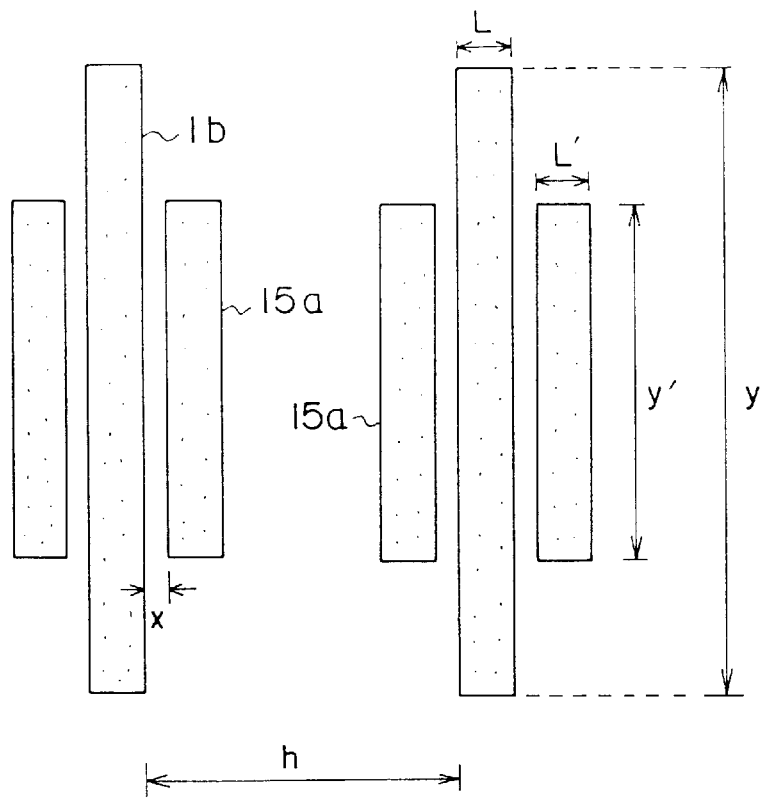
FIG. 14 is a top view of a fuse element according to the present invention.
Figure 15:
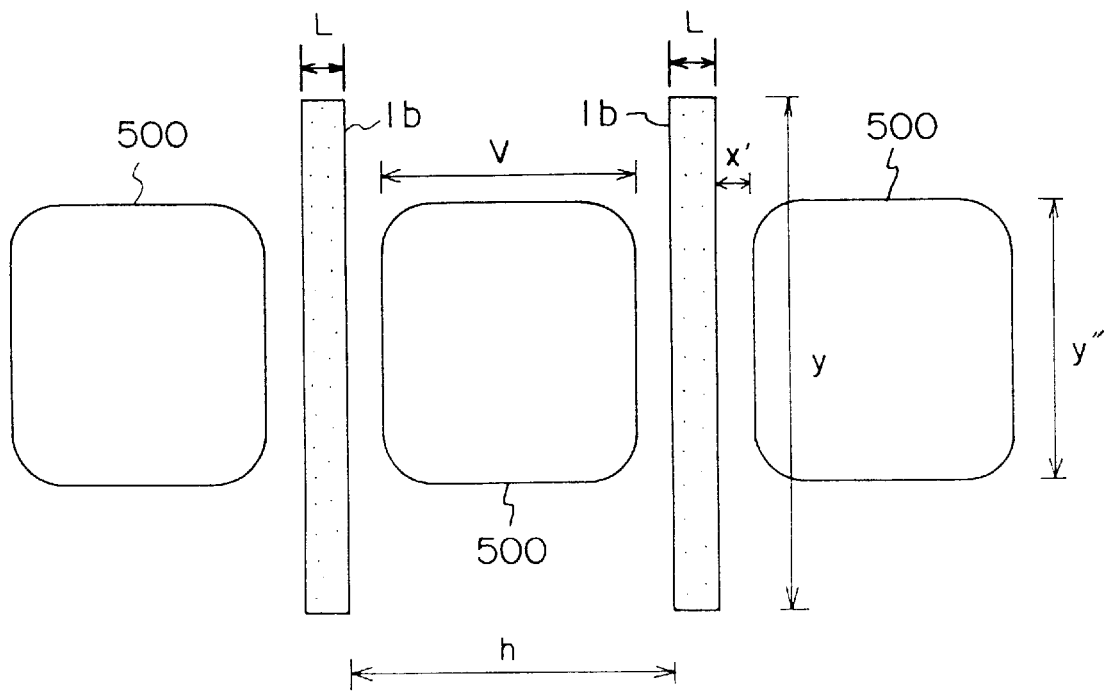
FIG. 15 is a top view of a fuse element according to the present invention.

Next, the formation of and location on the substrate of the fuse elements used in each of the above-described embodiments will be described. In FIG. 14 and FIG. 15, which show the top view of the fuse elements, the dummy fuse elements which are located to both side of the fuse elements, and the depression in the insulating film of the above-described embodiments. In FIG. 14, the width L of the fuse element 1b is such that $0<L<2$ μm, and the length y of the fuse element 1b is longer than the length y' of the dummy fuse elements 15a (that is y>y'). The distance x between the fuse elements 1b and the dummy fuse elements 15a is smaller than 2L (that is, x<2L). The width L' of the dummy fuse elements 15a is wider than L/4 and narrower than 2h/5 (that is, L/4<L'<2h/5, where h is the distance between neighboring fuse elements 1b. In FIG. 15, the width V of the depression 500 in the insulating film is smaller than the distance h between neighboring fuse elements 1b (that is, V<h). The length y' of the depression 500 is smaller than the length y of the fuse element 1b (that is, y'<y). The distance x' between the fuse element 1b and the depression 500 is shorter than 2L (that is, x'<2L)

While tungsten is used as the metal in the fuse element of the above-described embodiments, this is merely one example, and it is understood that it is also possible to use another high-melting-point metal or aluminum in place of tungsten.

By virtue of the above-described constitution of the present invention, by providing at least one dummy fuse on each side of the part of fuse element to be blown, the residual film of the blown fuse element joins with the dummy fuse element, so the electrical breaking of the fuse is reliably complete, the result being that it is possible to reduce the failure rate of the semiconductor device. Additionally, because dummy fuse elements or a groove or depression are provided between neighboring fuse elements in a fuse column so as to be shared between neighboring fuse elements, not only is the electrical breaking of the fuse done reliably, but also the reduction of the element size and the increase in the level of integration of the semiconductor device are facilitated.

What is claimed is:

1. A semiconductor device, comprising:

a semiconductor substrate on which are formed a plurality of semiconductor devices;

a wiring that is formed on the semiconductor substrate and makes electrical connection between the semiconductor devices;

at least two first fuse elements formed on an insulating surface of the semiconductor substrate that covers the semiconductor devices, each of said first elements having two sides and being connected to the wiring; and at least a second fuse element formed on the insulating surface, said second element being positioned to be blown away when at least one of the first fuse elements is blown away, said second fuse element being not connected to the wiring.

2. A semiconductor device according to claim 1, wherein both the first and second fuse elements are formed by a composite layer of titanium nitride film and a titanium film formed over the titanium nitride film, and a film of a refractory metal formed over the composite layer.

3. A semiconductor device according to claim 2, wherein the refractory metal is tungsten.

4. A semiconductor device according to claim 1, wherein both the first and second fuse elements including a composite layer having a titanium nitride film and a titanium film formed over the of titanium nitride film, and further including an aluminum film formed over the composite layer.

5. A semiconductor device according to claim 1, wherein the first and second fuse elements have like widths in a direction crossing both.

6. A semiconductor device according to claim 1, wherein a plurality of the first fuse elements are arranged along a direction crossing the two sides, and two of the first fuse elements nearest to each other have the second fuse element arranged therebetween.

7. The semiconductor device according to claim 1, wherein said two first elements are separated from each other by a first distance, and the second fuse element is separated from at least one of the two sides of each of the first fuse elements by a second distance shorter than the first distance.

8. A semiconductor device, comprising:

a semiconductor substrate on which are formed a plurality of semiconductor devices;

wiring on the semiconductor substrate electrically connecting the semiconductor devices;

at least a first fuse element on a supporting surface supported by the semiconductor substrate and connected to the wiring, the first fuse element having a portion to be blown and having a width narrower than a width of a remaining portion of the first fuse element not to be blown; and second fuse elements to be blown away when the first fuse element is blown away, each of said second fuse elements having a uniform width and not connected to the wiring, the second fuse elements being provided on the supporting surface in proximity to the first fuse element such that the second fuse elements face each other via the first fuse element, and being made of the same material as that of the first fuse element.

9. A semiconductor device comprising:

a semiconductor substrate on which are formed a plurality of semiconductor devices;

wiring on the semiconductor substrate electrically connecting the semiconductor devices;

a plurality of fuse elements on a supporting surface supported by the semiconductor substrate and connected to the wiring; and an insulating film formed on the semiconductor substrate and covering at least the fuse elements, the insulating film being provided with a groove to catch fluid flow when at least one of the first fuse elements is blown away located in proximity to at least one side of a portion of at least one of the fuse elements, the groove having a bottom surface lower than an adjacent bottom surface of said one of the fuse elements, the fuse elements being arranged in a row on the semiconductor substrate, and two of the fuse elements adjacent to each other, including said one of the fuse elements, share proximity to the groove of the insulating film.

10. A random access memory comprising:

at least one memory section provided in a semiconductor substrate;

at least one decoder section having at least a first and a second decoder and a first and a second spare decoder, the decoder section being provided in an area surrounding the memory section and being electrically connected to the memory section;

at least a first and a second fuse element provided adjacent to the decoder section and electrically connected to the first decoder and the first spare decoder, and to the second decoder and the second spare decoder, respectively, so that upon blowing at least either the first or the second fuse element, the first or the second decoder is electrically replaced; and a fuse section to be blown away when at least either of the first or the second fuse element is blown away, the fuse section being provided near a portion of the first and second fuse elements to be blown, the fuse section not being connected to the first and second decoders and the first and second spare decoders.

11. A random access memory according to claim 10, wherein the fuse section comprises at least a third fuse element made of the same material as that of the first and second fuse elements.

12. A random access memory according to claim 11, wherein the third fuse element has the same width as that of the first and second fuse elements on the semiconductor substrate.

13. A random access memory according to claim 10, wherein the portion of each of the first and second fuse elements to be blown is narrower than another portion of each of the first and second fuse elements not to be blown on the semiconductor substrate.

14. A random access memory according to claim 11, wherein the third fuse element is narrower than the portions of the first and second fuse elements to be blown.

15. The random access memory according to claim 10, wherein the first and second fuse elements are separated from each other by a first distance, and the fuse section is separated from each of the first and second fuse elements by a second distance shorter than the first distance.

16. A semiconductor apparatus comprising:

a semiconductor substrate;

a plurality of semiconductor devices on the semiconductor substrate, including first and second groups of said semiconductor devices; and means for interconnecting said plurality of semiconductor devices; including a plurality of fuse elements formed on an insulating surface of the semiconductor substrate to be used to substitute a semiconductor device of the second group for a semiconductor device of the first group whenever one of said fuse elements is blown, each one of the fuse elements comprising, a first fuse element portion interconnected with said first and second groups of semiconductor devices, with the first fuse element portion to be blown by focused radiant energy, and a second fuse element portion to be blown away when at least one of the first fuse elements is blown away, the second fuse element portion being not interconnected with said first and second groups of semiconductor devices.

17. The semiconductor apparatus according to claim 16, wherein:

the second fuse element portion comprises an isolated element adjacent to at least the first fuse element portion of said one fuse element, said isolated element serving to define an area for focusing of the focused radiant energy, said area being wider than said first fuse element portion.

18. The semiconductor apparatus according to claim 17, wherein the first fuse element portion includes a relatively narrowed region near at least a central portion of the isolated element.

19. The semiconductor apparatus according to claim 16, wherein:

the second fuse element portion comprises a pair of isolated elongated elements adjacent to and separated by the first fuse element portion.

20. The semiconductor apparatus according to claim 19, wherein:

another of the fuse elements is separated from said one fuse element by one of said pair of isolated elements so that said isolated element insures disconnection of any electrical connection through said another fuse element when said another fuse element is blown.

21. The semiconductor apparatus according to claim 16 wherein:

the second fuse element portion comprises a flow catchment between said one of said fuse elements and an adjacent another of said fuse elements to catch fluid material flow from either said one of said fuse elements or from said another of said fuse elements as may be respectively blown by focused radiant energy.

22. The semiconductor apparatus according to claim 21, wherein the flow catchment is a groove near said one and said another of said fuse elements.

23. The semiconductor apparatus according to claim 21, wherein:

the flow catchment is a depression between said one and said another of said fuse elements and separated therefrom by respective walls of material that will be fluidized by the focused radiant energy.

24. The semiconductor apparatus according to claim 16, wherein at least two first fuse element portions are separated from each other by a first distance, and said second fuse element portion is separated from at least two first fuse element portions by a second distance shorter than the first distance.

25. A semiconductor device, comprising:

a semiconductor substrate on which are formed a plurality of semiconductor devices;

a wiring on the semiconductor substrate and making electrical connection between the semiconductor devices;

a plurality of fuse elements on a supporting surface supported by the semiconductor substrate and connected to the wiring; and an insulating film formed on the semiconductor substrate and covering at least the fuse elements, the insulating film being provided with a depression located in proximity to at least one side of a portion of at least one of the fuse elements, the depression having a bottom surface lower than an adjacent bottom surface of said one of the fuse elements, the fuse elements being arranged in a row on the semiconductor substrate, and two of the fuse elements adjacent to each other, including said one of the fuse elements, sharing proximity to the depression of the insulating film.

26. A semiconductor device, comprising:

a semiconductor substrate on which are formed a plurality of semiconductor devices;

wiring on the semiconductor substrate electrically connecting the semiconductor devices;

a plurality of fuse elements on a supporting surface supported by the semiconductor substrate and connected to the wiring; and an insulating film formed on the semiconductor substrate and covering at least the fuses, wherein the insulating film is provided with a groove to catch fluid flow when at least one of the first fuse elements is blown away located in proximity to at least one side of a portion of at least one of the fuse elements, the groove has a bottom surface lower than an adjacent bottom surface of said one of the fuse elements, the fuse elements are arranged in a row on the semiconductor substrate, and two of the fuse elements adjacent to each other, including said one of the fuse elements, share proximity to the groove of the insulating film, and the groove is separated from each of the two fuse elements by a distance shorter than a distance between the two fuse elements.

27. A random access memory comprising:

at least one memory section provided in a semiconductor substrate;

at least one decoder section having at least a first and a second decoder and a first and a second spare decoder, the decoder section being provided in an area surrounding the memory section and electrically connected to the memory section;

at least a first and a second fuse element provided adjacent to the decoder section and electrically connected to the first decoder and the first spare decoder, and the second decoder and the second spare decoder, respectively, so that upon blowing at least either the first or the second fuse element, the first or the second decoder is electrically replaced with the first or the second spare decoder, respectively, the first and second fuse elements being separated from each other by a first distance; and an insulating film formed on the semiconductor substrate and covering at least the first and second fuse elements, the insulating film is provided with a depression to catch fluid flow when at least one of the fuse elements is blown away provided near a portion of the first and second fuse elements to be blown, for ensuring that disconnection by the blown fuse is complete, the depression being separated from each of the first and second fuse elements by a second distance shorter than the first distance.

28. A semiconductor device, comprising:

a semiconductor substrate on which are formed a plurality of semiconductor devices;

wiring on the semiconductor substrate electrically connecting the semiconductor devices;

a plurality of fuse elements on a supporting surface supported by the semiconductor substrate and connected to the wiring; and an insulating film formed on the semiconductor substrate and covering at least the fuses, the insulating film being provided with a depression to catch fluid flow when at least one of the fuse elements is blown away located in proximity to at least one side of a portion of at least one of the fuse elements, the depression having a bottom surface lower than an adjacent bottom surface of said one of the fuse elements, the fuse elements being arranged in a row on the semiconductor substrate, and two of the fuse elements adjacent to each other, including said one of the fuse elements, sharing proximity to the depression of the insulating film, the depression being separated from each of the two fuse elements by a distance shorter than a distance between the two fuse elements.

* * * * *